United States Patent
Kwak et al.

(10) Patent No.: US 11,203,802 B2
(45) Date of Patent: Dec. 21, 2021

(54) SINGLE LAYER ZINC ALLOY PLATED STEEL MATERIAL EXHIBITING EXCELLENT SPOT WELDABILITY AND CORROSION RESISTANCE, AND FABRICATION METHOD THEREFOR

(71) Applicant: POSCO, Pohang-si (KR)

(72) Inventors: Young-Jin Kwak, Gwangyang-si (KR); Tae-Yeob Kim, Gwangyang-si (KR)

(73) Assignee: POSCO, Pohang-si (KR)

( * ) Notice: Subject to any disclaimer, the term of this patent is extended or adjusted under 35 U.S.C. 154(b) by 181 days.

(21) Appl. No.: 16/472,475

(22) PCT Filed: Dec. 21, 2017

(86) PCT No.: PCT/KR2017/015222
§ 371 (c)(1),
(2) Date: Jun. 21, 2019

(87) PCT Pub. No.: WO2018/124630
PCT Pub. Date: Jul. 5, 2018

(65) Prior Publication Data
US 2020/0399745 A1 Dec. 24, 2020

(30) Foreign Application Priority Data
Dec. 26, 2016 (KR) ........................ 10-2016-0178835

(51) Int. Cl.
B32B 15/00 (2006.01)
C22C 38/06 (2006.01)
(Continued)

(52) U.S. Cl.
CPC .............. *C22C 38/06* (2013.01); *B23K 26/22* (2013.01); *B23K 35/3073* (2013.01);
(Continued)

(58) Field of Classification Search
None
See application file for complete search history.

(56) References Cited

U.S. PATENT DOCUMENTS

| | | |
|---|---|---|
| 5,002,837 A | 3/1991 | Shimogori et al. |
| 5,021,301 A | 6/1991 | Nakakoji et al. |

(Continued)

FOREIGN PATENT DOCUMENTS

| | | |
|---|---|---|
| CN | 103249860 | 8/2013 |
| CN | 103370434 | 10/2013 |

(Continued)

OTHER PUBLICATIONS

International Search Report—PCT/KR2017/015222 dated Mar. 27, 2018.

(Continued)

*Primary Examiner* — Seth Dumbris
(74) *Attorney, Agent, or Firm* — Cantor Colburn LLP

(57) ABSTRACT

Provided are a single layer zinc alloy plated steel material and a fabrication method therefor, the single layer zinc alloy plated steel material comprising a base iron and a zinc alloy plating layer formed on the base iron, wherein the zinc alloy plating layer contains 13-24 wt % of Mg, and the adhesion amount of the zinc alloy plating layer is at most 40 g/m² (excluding 0 g/m²).

9 Claims, 4 Drawing Sheets

(51) Int. Cl.
*B23K 26/22* (2006.01)
*B23K 35/30* (2006.01)
*C22C 38/00* (2006.01)
*C22C 38/02* (2006.01)
*C22C 38/04* (2006.01)
*C23C 14/02* (2006.01)
*C23C 14/14* (2006.01)
*C23C 14/28* (2006.01)
*C23C 14/50* (2006.01)
*B23K 103/04* (2006.01)

(52) U.S. Cl.
CPC ............ *C22C 38/002* (2013.01); *C22C 38/02* (2013.01); *C22C 38/04* (2013.01); *C23C 14/021* (2013.01); *C23C 14/14* (2013.01); *C23C 14/28* (2013.01); *C23C 14/50* (2013.01); *B23K 2103/04* (2018.08); *C21D 2211/001* (2013.01); *Y10T 428/12799* (2015.01)

(56) References Cited

U.S. PATENT DOCUMENTS

| | | | |
|---|---|---|---|
| 5,135,817 | A | 8/1992 | Shimogori et al. |
| 5,648,177 | A | 7/1997 | Fukui et al. |
| 2010/0104752 | A1 | 4/2010 | Choquet et al. |
| 2013/0295409 | A1* | 11/2013 | Chin .................. C23C 2/28 428/653 |
| 2015/0013409 | A1* | 1/2015 | Monnoyer .......... C23C 28/3225 72/41 |
| 2015/0030875 | A1 | 1/2015 | Lee et al. |
| 2015/0352812 | A1 | 12/2015 | Jung et al. |
| 2017/0095995 | A1* | 4/2017 | Tokuda .................. C22C 18/00 |
| 2018/0237900 | A1* | 8/2018 | Kobayashi .............. C23F 13/14 |

FOREIGN PATENT DOCUMENTS

| | | |
|---|---|---|
| CN | 104903493 | 9/2015 |
| JP | 01139755 | 6/1989 |
| JP | H02019474 | 1/1990 |
| JP | H02097663 | 4/1990 |
| JP | H03138389 | 6/1991 |
| JP | 09228030 | 9/1997 |
| JP | 2006265671 | 10/2006 |
| JP | 2013545900 | 12/2013 |
| JP | 2014501852 | 1/2014 |
| JP | 2016040413 | 3/2016 |
| KR | 19910008175 | 5/1991 |
| KR | 100295174 | 9/2001 |
| KR | 1020030054469 | * 7/2003 |
| KR | 20090122247 | 11/2009 |
| KR | 20140083836 | 7/2014 |
| KR | 20150071883 | 6/2015 |
| KR | 20150072999 | 6/2015 |
| KR | 101536453 | 7/2015 |
| KR | 20160054111 | 5/2016 |
| WO | 2012081738 | 6/2012 |

OTHER PUBLICATIONS

Chinese Office Action—Chinese Application No. 201780080861.7 dated Oct. 30, 2020, citing U.S. Pat. No. 5,021,301, JP 2006-265671, CN 103370434, U.S. Pat. No. 5,002,837, and CN 103249860.

Japanese Office Action—Japanese Application No. 2019-534715 dated Sep. 15, 2020, citing JP H03-138389, JP H02-097663, JP 2014-501852, KR 10-2014-0083836, JP H02-019474, KR 10-2015-0071883, JP 2013-545900, KR 10-2016-0054111, and US 2015/0352812.

European Search Report—European Application No. 17885934.4, dated Oct. 9, 2019, citing U.S. Pat. No. 5,002,837, KR 2015 0071883 and WO 2012/081738.

Chinese Office Action—Chinese Application No. 201780080861.7 dated Jun. 23, 2021, citing U.S. Pat. No. 5,021,301, CN 103370434, U.S. Pat. No. 5,002,837, CN 103249860, CN 104903493, and Jiang, et al.

Jiang, et al., Electrochemical Corrosion Behavior of Nanocrystalline Zinc Coatings in 3.5% NaCl Solution, Journal of Chinese Society for Corrosion and Protection, vol. 28, No. 5, Oct. 2008, pp. 303-306.

European Office Action—European Application No. 17885934.4 dated Sep. 14, 2021, citing U.S. Pat. No. 5,002,837, KR 10-2015-0071883, WO 2012/081738, and Jung, et al.

Jung, et al., Mg Content Dependence of EML-13 PVD Zn—Mg Coating Adhesion on Steel Strip, Metallurgical and Materials Transactions A, Jul. 2016, vol. 47, No. 9, pp. 4594-4605.

* cited by examiner

SINGLE LAYER ZINC ALLOY PLATED STEEL MATERIAL EXHIBITING EXCELLENT SPOT WELDABILITY AND CORROSION RESISTANCE, AND FABRICATION METHOD THEREFOR

TECHNICAL FIELD

The present disclosure relates to a single layer zinc alloy plated steel exhibiting excellent spot weldability and corrosion resistance and a method of manufacturing the same. More particularly, the present disclosure relates to a single layer zinc alloy plated steel exhibiting excellent spot weldability and corrosion resistance, which is applicable to automobiles, household appliances, building materials and the like, and a method of manufacturing the same.

BACKGROUND ART

A zinc plating method, suppressing the corrosion of iron through a cathode method, is widely used for manufacturing a steel material having high corrosion resistance due to excellent performance and economical efficiency. Demand for zinc-plated galvanized steel is increasing throughout industry including the automobile, home appliance, building materials industries and the like.

Such a zinc-plated steel material has characteristics of sacrificial corrosion protection in which zinc which is lower in oxidation-reduction potential than iron is first corroded when exposed to a corrosive environment to suppress corrosion of the steel. In addition, zinc on the plating layer is oxidized, forming a dense corrosion product on the steel surface, to block the steel from an oxidizing atmosphere, thereby improving the corrosion resistance of steel.

However, due to increasing industrial advancements, air pollution is increasing, corrosion environment have worsened, and resource and energy conservation are strictly regulated. Therefore, there is increasing need to develop a steel material having better corrosion resistance than the galvanized steel of the related art. To this end, various studies have been made on a technique of manufacturing a zinc alloy plated steel which improves corrosion resistance of steel by adding an element such as magnesium (Mg) or the like to a plating layer.

On the other hand, a zinc-plated steel material or a zinc alloy plated steel material (hereinafter, referred to as 'zinc plated steel') is generally processed into parts by processing or the like, and is then welded by spot welding or the like to be used as a product. In the case of a zinc plated steel in which a high strength steel containing austenite or retained austenite as a microstructure, a high P added high strength interstitial free (IF) steel, or the like is provided as a base, there is a problem in that liquid metal embrittlement (LME), in which zinc melting during spot welding penetrates along base steel grain boundaries to cause brittle cracks, occurs.

FIG. 1 is an enlarged view of an image obtained by capturing a welded portion of a welded member in which LME cracking occurred due to spot welding. In FIG. 1, cracks occurring in upper and lower portions of a nugget are referred to as Type A cracks, cracks occurring in a welding shoulder portion are referred to as Type B cracks, and cracks occurring inside a steel sheet due to electrode misalignment during welding are referred to as Type C cracks. Since Type B and C cracks significantly affect the stiffness of a material, a key requirement in the art may be to prevent the occurrence of cracks during welding.

DISCLOSURE

Technical Problem

An aspect of the present disclosure is to provide a single layer zinc alloy plated steel having excellent spot weldability and corrosion resistance, and a method of manufacturing the same.

Technical Solution

According to an aspect of the present disclosure, a single layer zinc alloy plated steel comprises a base steel and a zinc alloy plating layer disposed on the base steel. The zinc alloy plating layer includes 13 to 24 wt % of magnesium (Mg), and a plating amount of the zinc alloy plating layer is 40 $g/m^2$ or less (excluding 0 $g/m^2$).

According to another aspect of the present disclosure, a method of manufacturing a single layer zinc alloy plated steel comprises preparing a base steel, and levitating and heating a coating material by electromagnetic force in a vacuum chamber to generate zinc (Zn) and magnesium (Mg) alloy deposition vapor, and inducing and spraying the Zn and Mg alloy deposition vapor onto a surface of the base steel to form a Mg deposition layer. A content of Mg in the Zn and Mg alloy deposition vapor is 13 to 24 wt %, and a plating amount of a zinc alloy plating layer is 40 $g/m^2$ or less (excluding 0 $g/m^2$).

Advantageous Effects

Among various effects according to an embodiment in the present disclosure, a single layer zinc alloy plated steel according to an embodiment has excellent spot weldability, and has an advantage in that the occurrence of liquid metal embrittlement (LME) is effectively suppressed, even in the case in which a high strength steel containing austenite or retained austenite as a microstructure, a high P added high strength interstitial free (IF) steel, or the like is provided as a base.

Further, the multilayer zinc alloy plated steel according to an embodiment may secure excellent corrosion resistance even with a small amount of adhesion, thereby being environmentally friendly and economical.

It is to be understood that embodiments in the present disclosure are not limited to the described embodiments, The various and advantageous advantages and effects according to embodiments in the present disclosure are not limited to the above descriptions, and may be more readily understood in the course of describing a detailed embodiment of the present disclosure.

BEST MODE FOR INVENTION

Figure 1:
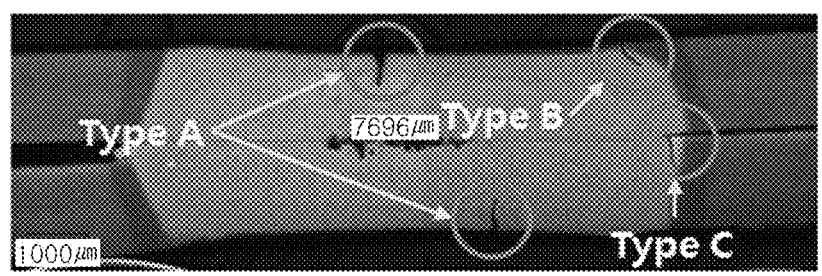
FIG. 1 is an enlarged view of an image obtained by capturing a welded portion of a welded member in which LME cracking occurred by spot welding.

In the case of Zn—Mg alloy plated steel, an increase in the content of Mg is favorable in terms of corrosion resistance, but it is known to be disadvantageous in terms of spot weldability. Accordingly, the Mg content in a plating layer is usually controlled to be about 10% by weight at most since a Zn—Mg intermetallic compound having a low melting point is easily dissolved in a Zn—Mg plating layer to cause embrittlement of a liquid metal. However, as a result of further research according to an embodiment in the present disclosure, even in the case in which the Mg content in a plating layer exceeds 10% by weight, when an average content thereof is within a predetermined range and a deviation of the Mg content in a width direction of the plating layer is also within a predetermined range, spot weldability is remarkably improved.

Hereinafter, a single layer zinc alloy plated steel having excellent spot weldability and corrosion resistance will be described in detail.

The single layer zinc alloy plated steel according to an embodiment in the present disclosure includes abase steel and a zinc alloy plating layer formed on the base steel. According to an embodiment in the present disclosure, the form of the base steel is not particularly limited, and may refer to, for example, a steel sheet or a steel wire.

According to an embodiment in the present disclosure, the composition of the base steel is not particularly limited. For example, the base steel may comprise, by weight %, 0.10 to 1.0% of C, 0.5 to 3% of Si, 1.0 to 25% of Mn, 0.01 to 10% of Al, 0.1% or less of P (excluding 0%), 0.01% or less of S (excluding 0%), and remainders of Fe and unavoidable impurities. In this case, the contents of C, Si, Mn, P and S may satisfy the following relational expression 1. On the other hand, the base steel having the above composition may comprise austenite or retained austenite as a microstructure.

$$[C]+[Mn]/20+[Si]/30+2[P]+4[S] \geq 0.3 \quad \text{[Relational Expression 1]}$$

where [C], [Mn], [Si], [P] and [S] refer to the contents of corresponding elements (weight %).

In the case in which the alloy composition and microstructure as described above are provided, liquid metal embrittlement (LME) may be a major problem, for the following reasons. For example, the austenite or retained austenite microstructure has vulnerable grain boundaries than those of other microstructures. In a case in which stress is applied thereto by spot welding, molten zinc in a liquid phase penetrates into grain boundaries of the austenite or retained austenite microstructure on welded portions to cause occurrence of cracks, thereby causing LME, brittle fracture.

However, according to an embodiment in the present disclosure, as described later, since a period of time during which molten zinc remains in the liquid phase is significantly reduced, even in the case in which the steel material having the above-described alloy composition and microstructure is used as abase steel in manufacturing the zinc alloy plated steel, the occurrence of LME may be effectively suppressed. In addition, even in a case in which the alloy composition of the base steel does not satisfy the above-mentioned range, an embodiment in the present disclosure may also be applied thereto.

The zinc alloy plating layer contains 13 to 24% by weight of Mg, and the remainder is comprised of Zn and unavoidable impurities. In more detail, the Mg content may be 15.7 to 20% by weight.

Figure 2:
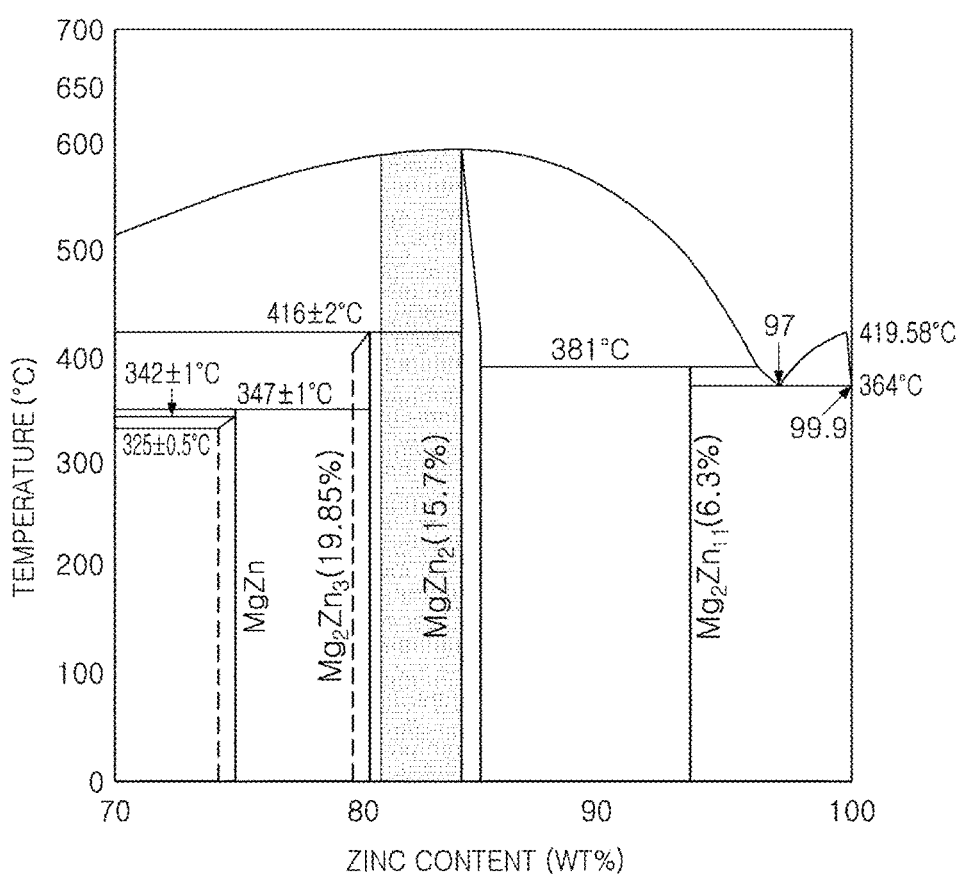
FIG. 2 is a phase diagram of an Mg—Zn binary system alloy.

In the case of a Zn—Mg based zinc alloy plating layer, a plating structure may be composed of a Zn single phase, a Mg single phase, a $Mg_2Zn_{11}$ alloy phase, a $MgZn_2$ alloy phase, a Mg—Zn alloy phase, $Mg_7Zn_3$ alloy phase, and the like. According to an embodiment in the present disclosure, it can be appreciated that, when the Mg content contained in the zinc alloy plating layer is controlled to be in the above-mentioned range, the zinc alloy plating layer on a welded portion is melted during spot welding to change into an alloy layer including 90 area % or more (including 100 area %) of $MgZn_2$ alloy phase, thereby effectively suppressing liquid metal embrittlement (LME). As can be seen from FIG. 2, in a phase diagram of a Mg—Zn binary alloy, for example, since the melting point of the plating layer is relatively high, a period of time during which a molten plating layer remains in a liquid phase may be significantly reduced. On the other hand, according to an embodiment in the present disclosure, the residual structure, except for the $MgZn_2$ alloy phase, out of the plating layer on the welded portion, is not particularly limited, but the remainder except for the $MgZn_2$ alloy phase may be a $Mg_2Zn_{11}$ alloy phase, according to an embodiment without any limitation.

In this case, a phase fraction may be analyzed and measured using a standardless Rietveld quantitative analysis method using general XRD, and also using a more precise TEM-based crystal orientation mapping technique (TEM-ASTAR), but an embodiment thereof is not limited thereto. On the other hand, a phase transformation process of the Zn—Mg alloy plating layer may be analyzed using high-temperature in-situ synchrotron radiation XRD. In more detail, while heating the sample at heating rates of 1.3° C./sec and 11.3° C./sec and at a heating temperature of 780° C.; consecutively measuring an XRD spectrum of each frame per 1 second throughout 900 frames during a heating and cooling thermal cycle, to analyze a phase transformation process of the Zn—Mg alloy plating layer, but an embodiment thereof is not limited thereto.

On the other hand, even when the content of Mg is controlled to be in the above-described range, if the Mg content is excessive in a width direction of the plating layer, it may be difficult to obtain required improvement in spot weldability. Considering such characteristics, an upper limit of the deviation of the Mg content in the width direction of the plating layer may be appropriately managed. The deviation of the Mg content may thus be controlled to be within ±5% when the GDS profile is measured on a central portion of the zinc alloy plating layer in the thickness direction.

Figure 3:
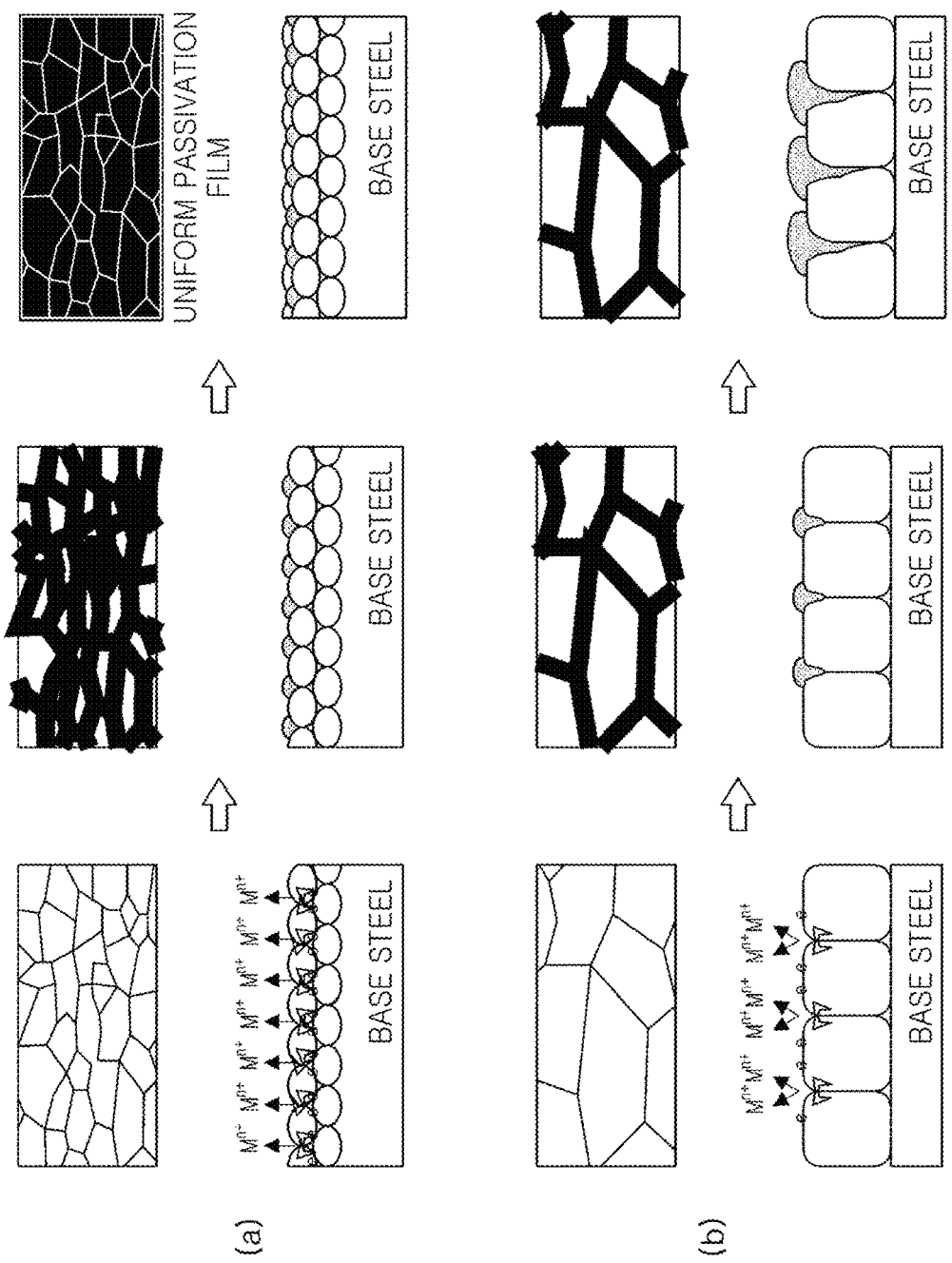
FIG. 3 is a schematic view illustrating the corrosion process of a plated steel material.

According to further research results according to an embodiment in the present disclosure, an average size of grains constituting the zinc alloy plating layer significantly affects corrosion resistance of the plated steel material. FIG. 3 is a schematic view illustrating a corrosion process of the plated steel material. FIG. 3(a) is a schematic view of the case in which the grain size is fine, and FIG. 3(b) is a schematic view of the case in which the grain size is coarse. Referring to FIGS. 3(a) and 3(b), it can be seen that when the crystal grain size is fine, a relatively dense and uniform corrosion product is formed at the time of corrosion progress, and thus, the corrosion may be relatively further delayed.

In addition, the average size of the grains constituting the zinc alloy plating layer also has a considerable influence on the spot weldability of the plated steel material. When the average grain size of the grains is a predetermined level or less, the occurrence of Type B and Type C cracks is significantly reduced. Such a reduction in crack occurrence may be obtained since atoms in a molten plated layer actively move.

Thus, in consideration of both the corrosion resistance and the spot weldability of the plated steel material, it is necessary to appropriately manage the upper limit of the average size of the grains constituting the zinc alloy plating layer. For example, the average size of the grains constituting the zinc alloy plating layer may be controlled to be 100 nm or less (excluding 0 nm). In this case, the 'average size of grains' refers to an average long diameter of grains obtained at the time of measuring the grains of the plating layer.

According to an example, a plating amount of the zinc alloy plating layer may be 40 g/m$^2$ or less (excluding 0 g/m$^2$). As the plating amount of the zinc alloy plating layer increases, it may be advantageous in terms of corrosion resistance, but due to the increase in a plating amount, the LME may be caused during spot welding. Therefore, considering weldability, the upper limit thereof may be limited to the above range. On the other hand, in more detail, a range of the sum of plating amounts of multilayered plating layers, considering both corrosion resistance and spot weldability, may be 10 to 35 g/m$^2$, and in further detail, 15 to 30 g/m$^2$.

The single layer zinc alloy plated steel according to an embodiment in the present disclosure described above may be manufactured by various methods, and the manufacturing method is not particularly limited, but the following method may be used as one embodiment.

Hereinafter, a method of manufacturing a single layer zinc alloy plated steel having excellent spot weldability and corrosion resistance according to another embodiment in the present disclosure will be described in detail.

First, a base steel is prepared, and foreign substances and a natural oxide film are removed from a surface of the base steel by pickling, rinsing and drying, using 14% by weight or more of HCl aqueous solution, and then by using plasma, ion beam, or the like. Then, a zinc alloy plating layer is formed on a surface of the base steel, thereby forming the single layer zinc alloy plated steel according to an embodiment in the present disclosure.

In this case, the zinc alloy plating layer may be formed by electromagnetic levitation physical vapor deposition having an electromagnetic stirring effect.

Figure 4:
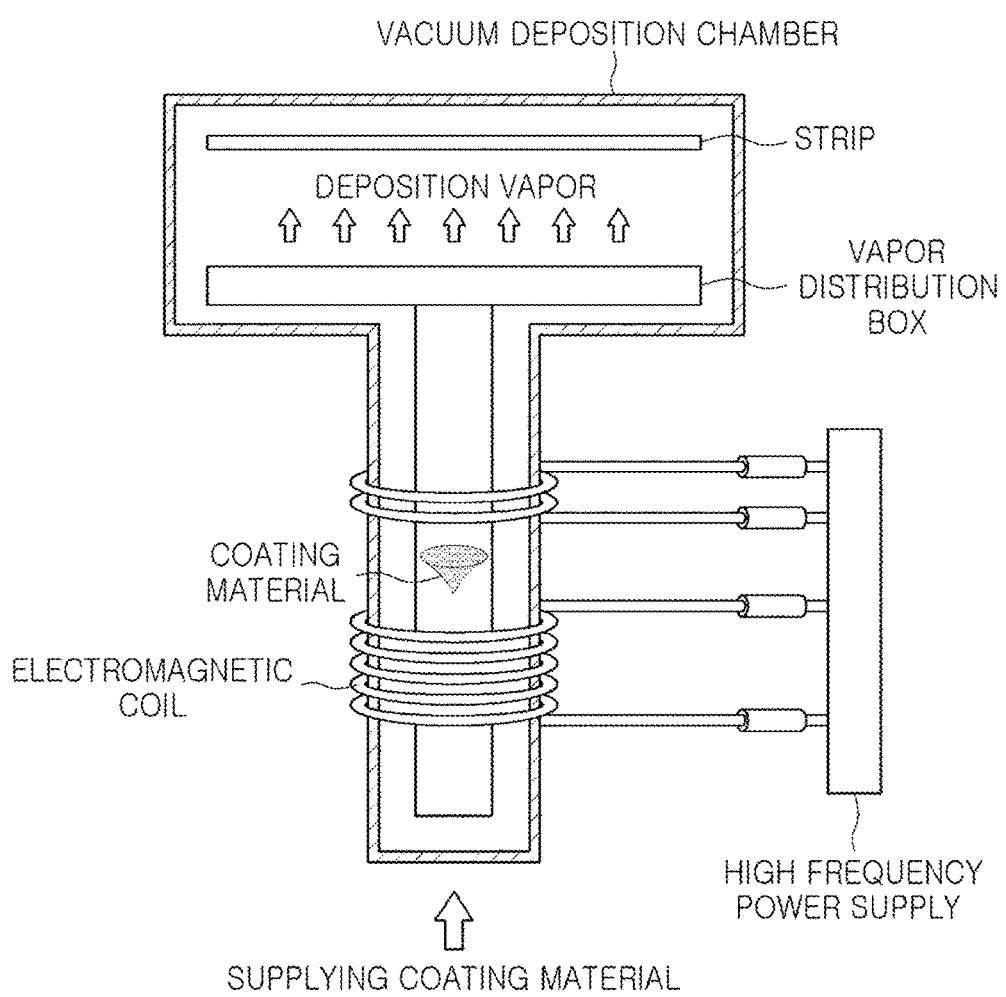
FIG. 4 is a schematic diagram of an electromagnetic levitation physical vapor deposition apparatus.

In this case, the electromagnetic levitation physical vapor deposition means a phenomenon in which, when high-frequency power is applied to one pair of electromagnetic coils generating an alternating electromagnetic field to generate electromagnetic force, a deposition material (Zn, Mg or a Zn—Mg alloy in the present disclosure) is floated in the air in a space enclosed by the alternating electromagnetic field without help externally, and the floating deposition material generates a large amount of metal vapor. FIG. 4 is a schematic diagram of an apparatus for such electromagnetic levitation physical vapor deposition. Referring to FIG. 4, a large amount of metal vapor formed by the above-described deposition method is sprayed onto the surface of the base steel at high speed through a plurality of nozzles of a vapor distribution box, to form a plating layer thereon.

In a general vacuum deposition apparatus, a deposition material is provided inside a crucible, and vaporization of the deposition material is performed by heating the crucible provided with the deposition material. In this case, there are difficulties in supplying sufficient heat energy to the deposition material itself due to melting of the crucible, heat loss through the crucible or the like. Accordingly, the deposition rate is relatively slow, and furthermore, there is a limit in miniaturizing the grain size of the plating layer. In addition, in depositing the Zn—Mg alloy vapor as in the present disclosure, there is a limit in securing homogeneity of the plating layer.

However, in a manner different from the general vacuum deposition method, when the deposition is performed by the electromagnetic levitation physical vapor deposition method, the deposition material may be exposed to a relatively high temperature without constraint by temperature. As a result, high-speed deposition may be performed, and the grain size of a formed plating layer is minute, and furthermore, alloying elements in the plating layer may be homogeneously distributed.

The degree of vacuum in a vacuum deposition chamber during a deposition process may be controlled under the conditions of $1.0\times10^{-3}$ mbar to $1.0\times10^{-5}$ mbar. In this case, in the process of forming the plating layer, an increase in brittleness and a decrease in properties due to formation of oxide in the process of forming the plating layer may be effectively prevented.

The temperature of a coating material floating in the deposition process may be controlled to be 700° C. or higher, in detail, 800° C. or higher, and in more detail, 1000° C. or higher. If the temperature thereof is less than 700° C., there is a fear that the grain refinement and the plating layer homogenization effect may not be sufficiently secured. On the other hand, as the temperature of a floating coating material is increased, it may be advantageous in terms of obtaining the required technical effect. Therefore, although an upper limit according to an embodiment is not particularly limited, if the temperature thereof is higher than a certain level, the effect may be saturated and the process cost may be excessively high. Thus, the upper limit thereof may be limited to 1500° C.

The temperature of the base steel before and after deposition may be controlled to be 100° C. or lower. If the temperature of the base steel exceeds 100° C., due to curvature of the base steel based on temperature unevenness thereof in a width direction, the maintenance of a vacuum degree may be interfered when passing through an exit-side multistage differential decompression system.

MODE FOR INVENTION

Hereinafter, embodiments in the present disclosure will be described in more detail with reference to examples. However, the description of these embodiments is intended only to illustrate the practice of the present disclosure, but are not limited thereto, and the scope of the present disclosure is determined by the matters described in the claims and the matters reasonably deduced therefrom.

EMBODIMENT

A high strength cold rolled steel sheet for automobiles, having a thickness of 1.4 mm and including, by weight %, 0.16% of C, 1.43% of Si, 2.56% of Mn, 0.04% of Al, 0.006% of P, 0.003% of S, and remainders of Fe and unavoidable impurities, was prepared. A single layer zinc alloy plated steel having a zinc alloy plating layer having the composition shown in Table 1 below was produced by using an apparatus (having a vacuum degree of $3.2\times10^{-3}$ mbar) shown in FIG. 4. In all examples, when forming a zinc alloy plating layer, the current applied to one pair of electromagnetic coils was 1.2 kA, the frequency applied to the pair of electromagnetic coils was 60 kHz, based on 2 kg of a deposition material, the temperature of a floated coating material was 1000° C., and the temperature of a vapor distribution box was kept constant at 900° C. In addition, the temperature of the base steel before and after deposition of the zinc alloy plating layer was maintained at 60° C.

Next, an Mg content and a plating amount of the manufactured zinc alloy plating layer were measured by an inductively coupled plasma (ICP) method. In detail, the plated steel sheet was cut into specimens of 80 mm×80 mm size. The surface of the specimen was degreased and then subjected to a first basis weight (W1: 0.0000 g) using a high-precision scale. Then, an O-ring of 54.5 mm dia. dedicated column was attached on a front surface of the specimen with a clamp, to be closely contacted with each other such that a solution could be prevented from leaking. Thereafter, 30 cc of a 1:3 HCl solution was added, and 2 to 3 drops of an inhibitor were added. After the generation of $H_2$ gas was completed on the surface of the specimen, the solution was collected in a 100 cc mass flask. At this time, the remaining amount of the solution on the surface of the specimen was collected, using a washing bottle, to be collected in an amount of 100 cc or lower. The specimen was completely dried and then subjected to a second basis weight (W2). A value obtained by dividing a difference between the first and second basis weights by the unit area was defined as the plating amount of the zinc alloy plating layer. On the other hand, the Mg content in the collected solution was measured by the ICP method.

Next, a GDS profile of a central portion of the zinc alloy plating layer in a thickness direction was measured, and an average size of grains forming the zinc alloy plating layer was measured. As a result, the variation of the Mg content in all examples was within ±5%, and the average grain size was 100 nm or less.

Next, spot weldability and corrosion resistance of the manufactured single layer zinc alloy plated steel were evaluated, and the results thereof are shown in Table 1 below.

In detail, the spot weldability was measured with a specimen of 40 mm×120 mm in size, cut according to the SEP 1220-2 standard. A total of 100 times of spot welding were performed on each specimen, and the presence or absence of Type B crack and the size thereof were measured, and thus, the spot weldability was measured based on the following criteria.

1. Very good: No Type-B cracks on all specimens
2. Excellent: Type B cracks occur in some or all specimens, and the average length of Type B cracks is 0.1 time or less the thickness of the base steel (cold rolled steel)
3. Normal: Type B cracks occur in some or all specimens, and the average length of type B cracks exceeds 0.1 time the thickness of the base steel (cold rolled steel) and is 0.2 time or less the thickness of the base steel (cold rolled steel).
4. Defective: Type B cracks occur in some or all specimens, and the average length of type B cracks exceeds 0.2 time the thickness of the base steel (cold rolled steel).

The corrosion resistance was evaluated by measuring the generation period of time of initial red rust by performing a salt spray test according to JIS 22371 after cutting each of the single layer zinc alloy plated steel into specimens having a size of 75 mm×150 mm, and was evaluated based on the following criteria.

1. Excellent: When a red rust generation period of time is twice or more that of a galvanized steel sheet (GI steel sheet) with a plating amount of 60 $g/m^2$ on one side
2. Normal: When a red rust generation period of time is equal to or more than that of a galvanized steel sheet (GI steel sheet) with a plating amount of 60 $g/m^2$ on one side, and less than twice that of a galvanized steel sheet (GI steel sheet) with a plating amount of 60 $g/m^2$ on one side
3. Defective: When a red rust generation period of time is shorter than that of a galvanized steel sheet (GI steel sheet) with a plating amount of 60 $g/m^2$ on one side

TABLE 1

| No. | Plating Layer Type (weight %) | Plating Amount ($g/m^2$) | Spot Weldability | Corrosion Resistance | Remarks |
|---|---|---|---|---|---|
| 1 | Zn—Mg (10% Mg) | 20 | 4 | 1 | Comparative Example 1 |
| 2 | Zn—Mg (12% Mg) | 20 | 4 | 1 | Comparative Example 2 |
| 3 | Zn—Mg (12.8% Mg) | 20 | 3 | 1 | Comparative Example 3 |
| 4 | Zn—Mg (13% Mg) | 20 | 2 | 1 | Inventive Example 1 |
| 5 | Zn—Mg (15% Mg) | 20 | 2 | 1 | Inventive Example 2 |
| 6 | Zn—Mg (15.5% Mg) | 20 | 2 | 1 | Inventive Example 3 |
| 7 | Zn—Mg (15.8% Mg) | 20 | 1 | 1 | Inventive Example 4 |
| 8 | Zn—Mg (18% Mg) | 20 | 1 | 1 | Inventive Example 5 |
| 9 | Zn—Mg (18% Mg) | 25 | 1 | 1 | Inventive Example 6 |
| 10 | Zn—Mg (18% Mg) | 30 | 1 | 1 | Inventive Example 7 |
| 11 | Zn—Mg (18% Mg) | 34 | 1 | 1 | Inventive Example 8 |
| 13 | Zn—Mg (18% Mg) | 40 | 2 | 1 | Inventive Example 9 |
| 14 | Zn—Mg (19.8% Mg) | 20 | 1 | 1 | Inventive Example 10 |
| 15 | Zn—Mg (20.1% Mg) | 20 | 2 | 1 | Inventive Example 11 |
| 16 | Zn—Mg (21.5% Mg) | 20 | 2 | 1 | Inventive Example 12 |
| 17 | Zn—Mg (22.8% Mg) | 20 | 2 | 1 | Inventive Example 13 |
| 18 | Zn—Mg (23.2% Mg) | 20 | 3 | 1 | Comparative Example 4 |
| 19 | Zn—Mg (25% Mg) | 20 | 4 | 1 | Comparative Example 5 |

Referring to Table 1, it can be confirmed that Inventive Examples 1 to 13 satisfying all the conditions proposed according to an embodiment in the present disclosure exhibit not only excellent corrosion resistance but also excellent spot weldability. Further, to obtain further improved spot weldability, the weight ratio of Mg may be controlled to be within a range of 0.157 to 0.20, and the sum of plating amounts of multilayer plating layers may be controlled to be 35 $g/m^2$ or less.

Meanwhile, in the case of Comparative Examples 1 to 5, it can be confirmed that the Mg weight ratio deviates from the range suggested according to an embodiment in the present disclosure, and the spot weldability is poor as compared with a required target.

Figure 5:
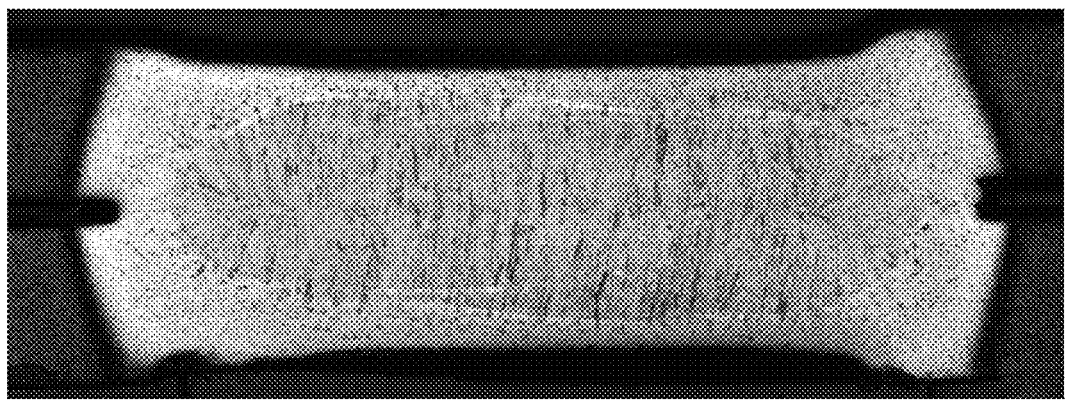
FIG. 5 is an image of a welded portion of a single layer zinc alloy plated steel of Inventive Example 5 in the present disclosure.

FIG. 5 is an image of a welded portion imaged after spot welding is performed on a single layer zinc alloy plated steel of Inventive Example 5. Referring to FIG. 5, in the case of the single layer zinc alloy plated steel according to an embodiment in the present disclosure, it can be visually confirmed that no Type B cracks or no Type C cracks occur in the welded portion at all.

The invention claimed is:

1. A single layer zinc alloy plated steel comprising:
a base steel and a zinc alloy plating layer disposed on the base steel,
wherein the zinc alloy plating layer includes 13 to 24 wt % of magnesium (Mg), a plating amount of the zinc alloy plating layer is 40 g/m² or less (excluding 0 g/m²), and an average grain size of crystal grains constituting the zinc alloy plating layer is 100 nm or less (excluding 0 nm).

2. The single layer zinc alloy plated steel of claim 1, wherein the zinc alloy plating layer comprises 15.7 to 20 wt % of Mg.

3. The single layer zinc alloy plated steel of claim 1, wherein the plating amount of the zinc alloy plating layer is 10 to 35 g/m².

4. The single layer zinc alloy plated steel of claim 1, wherein, when a GDS profile on a central portion of the zinc alloy plating layer in a thickness direction is measured, a deviation of Mg content is within ±5%.

5. The single layer zinc alloy plated steel of claim 1, wherein, during spot welding of the single layer zinc alloy plated steel, a zinc alloy plating layer on a welded portion is changed to an alloy layer comprising 90% or more by area (including 100% by area) of $MgZn_2$ alloy phase.

6. The single layer zinc alloy plated steel of claim 1, wherein an average length of Type B cracks in the single layer zinc alloy plated steel is 0.1 time or less a base steel thickness when spot welding is performed according to SEP 1220-2 standard.

7. The single layer zinc alloy plated steel of claim 1, wherein the base steel comprises, by weight %, 0.10 to 1.0% of carbon (C), 0.5 to 3% of silicon (Si), 1.0 to 25% of manganese (Mn), 0.01 to 10% of aluminum (Al), 0.1% or less (excluding 0%) of phosphorus (P), 0.01% or less (excluding 0%) of sulfur (S), and remainders of iron (Fe) and unavoidable impurities.

8. The single layer zinc alloy plated steel of claim 7, wherein the contents of C, Si, Mn, P and S contained in the base steel satisfy the following relational expression 1:
[C]+[Mn]/20+[Si]/30+2[P]+4[S]≥0.3, where [C], [Mn], [Si], [P] and [S] are the contents (weight %) of respective elements.

9. The single layer zinc alloy plated steel of claim 7, wherein the base steel comprises one or more of austenite and retained austenite as a microstructure.

\* \* \* \* \*